United States Patent
Nowak

(10) Patent No.: US 7,329,937 B2
(45) Date of Patent: Feb. 12, 2008

(54) ASYMMETRIC FIELD EFFECT TRANSISTORS (FETS)

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 10/908,095

(22) Filed: Apr. 27, 2005

(65) Prior Publication Data

US 2006/0244077 A1 Nov. 2, 2006

(51) Int. Cl.
*H01L 21/20* (2006.01)

(52) U.S. Cl. .................. 257/486; 257/471; 257/449; 257/408; 257/409; 257/368; 257/348; 257/344; 257/E27.138

(58) Field of Classification Search ............... 257/471, 257/486, 449, 409, 408, 368, 348, 344, E27.138
See application file for complete search history.

(56) References Cited

U.S. PATENT DOCUMENTS

| | | | |
|---|---|---|---|
| 4,300,152 A | 11/1981 | Lepselter | |
| 4,312,113 A | 1/1982 | Calviello | |
| 5,177,568 A * | 1/1993 | Honma et al. | 257/295 |
| 5,663,584 A | 9/1997 | Welch | |
| 5,760,449 A | 6/1998 | Welch | |
| 6,093,609 A * | 7/2000 | Chuang | 438/286 |
| 6,353,251 B1 * | 3/2002 | Kimura | 257/473 |
| 6,413,829 B1 | 7/2002 | Yu | |
| 6,531,743 B1 | 3/2003 | Hirashita et al. | |
| 6,750,088 B2 | 6/2004 | Hirashita et al. | |
| 2002/0011613 A1 | 1/2002 | Yagishita et al. | |
| 2002/0048841 A1 | 4/2002 | Bryant et al. | |
| 2002/0179980 A1 | 12/2002 | Yagishita et al. | |
| 2003/0094637 A1 | 5/2003 | Awano | |
| 2003/0209739 A1 | 11/2003 | Hisamoto et al. | |
| 2004/0142524 A1 | 7/2004 | Grupp et al. | |

FOREIGN PATENT DOCUMENTS

| JP | 60154661 A | 8/1985 |
|---|---|---|
| JP | 2100367 A | 4/1990 |

* cited by examiner

*Primary Examiner*—Lynne Gurley
*Assistant Examiner*—Samuel A Gebremariam
(74) *Attorney, Agent, or Firm*—Schmeiser, Olsen & Watts; William D. Sabo

(57) ABSTRACT

A semiconductor structure and a method for forming the same. The structure includes (a) a semiconductor channel region, (b) a semiconductor source block in direct physical contact with the semiconductor channel region; (c) a source contact region in direct physical contact with the semiconductor source block, wherein the source contact region comprises a first electrically conducting material, and wherein the semiconductor source block physically isolates the source contact region from the semiconductor channel region, and (d) a drain contact region in direct physical contact with the semiconductor channel region, wherein the semiconductor channel region is disposed between the semiconductor source block and the drain contact region, and wherein the drain contact region comprises a second electrically conducting material; and (e) a gate stack in direct physical contact with the semiconductor channel region.

6 Claims, 6 Drawing Sheets

ASYMMETRIC FIELD EFFECT TRANSISTORS (FETS)

BACKGROUND OF THE INVENTION

1. Technical Field

The present invention relates to field effect transistors (FETs), and more specifically, to asymmetric FETs.

2. Related Art

In a typical field effect transistor (FET), there is a trade-off between (a) the quality of the electric contacts coupled to the source/drain (S/D) regions of the FET (or in short, S/D contacts) and (b) the FET size. For example, to achieve better S/D contacts, the S/D regions can be doped more heavily. However, this increases the depth of dopants of the S/D regions and leads to degraded short-channel behaviors, such as increased Drain-Induced Barrier Lowering, increased subthreshold swing, and increased variability of threshold voltage. Thus it is noted that a channel being too short may have undesirable short channel effects. As a result, to keep the channel from being too short, the gate length must be increased so as to separate further the S/D regions from each other. This increases the size of the FET and costs more chip area, increases chip power, and increases circuit delay, which are undesirable.

Therefore, there is a need for an FET (and a method for forming the same) which has a better trade-off balance between the S/D contacts and FET size than that of the prior art.

SUMMARY OF THE INVENTION

The present invention provides a semiconductor structure, comprising (a) a semiconductor channel region doped with a first doping polarity; (b) a semiconductor source block doped with a second doping polarity and in direct physical contact with the semiconductor channel region; (c) a source contact region in direct physical contact with the semiconductor source block, wherein the source contact region comprises a first electrically conducting material, and wherein the semiconductor source block physically isolates the source contact region from the semiconductor channel region, and (d) a drain contact region in direct physical contact with the semiconductor channel region, wherein the semiconductor channel region is disposed between the semiconductor source block and the drain contact region, and wherein the drain contact region comprises a second electrically conducting material; and (e) a gate stack in direct physical contact with the semiconductor channel region.

The present invention also provides a semiconductor structure fabrication method, comprising (a) providing (i) a semiconductor substrate including a channel region which is doped with a first doping polarity and (ii) a gate stack in direct physical contact with the channel region; (b) forming a source block in the semiconductor substrate, doped with a second doping polarity, and in direct physical contact with the channel region; (c) forming a source contact region in direct physical contact with the source block, wherein the source contact region comprises a first electrically conducting material, and wherein the source block physically isolates the source contact region and the channel region; and (d) forming a drain contact region in direct physical contact with the channel region, wherein the channel region is disposed between the source block and the drain contact region, and wherein the drain contact region comprises a second electrically conducting material.

The present invention also provides a semiconductor structure, comprising (a) a semiconductor channel region doped with a first doping polarity; (b) a semiconductor source block doped with a second doping polarity and in direct physical contact with the semiconductor channel region; (c) a source contact region in direct physical contact with the semiconductor source block, wherein the source contact region comprises a first electrically conducting material, and wherein the semiconductor source block physically isolates the source contact region from the semiconductor channel region, and (d) a drain contact region in direct physical contact with the semiconductor channel region, wherein the semiconductor channel region is disposed between the semiconductor source block and the drain contact region, and wherein the drain contact region comprises a second electrically conducting material; and (e) a gate dielectric region in direct physical contact with the semiconductor channel region, wherein the gate dielectric region and the semiconductor channel region have a first common interfacing surface; and (f) a gate electrode region in direct physical contact with the gate dielectric region and electrically insulated from the semiconductor channel region by the gate dielectric region, wherein the semiconductor channel region and the semiconductor source block are formed on a semiconductor substrate having a top surface essentially perpendicular to the first common interfacing surface of the gate dielectric region and the semiconductor channel region.

The present invention provides an FET (and a method for forming the same) which has a better trade-off balance between S/D contacts and the FET size than that of the prior art.

DETAILED DESCRIPTION OF THE INVENTION

Figure 1:
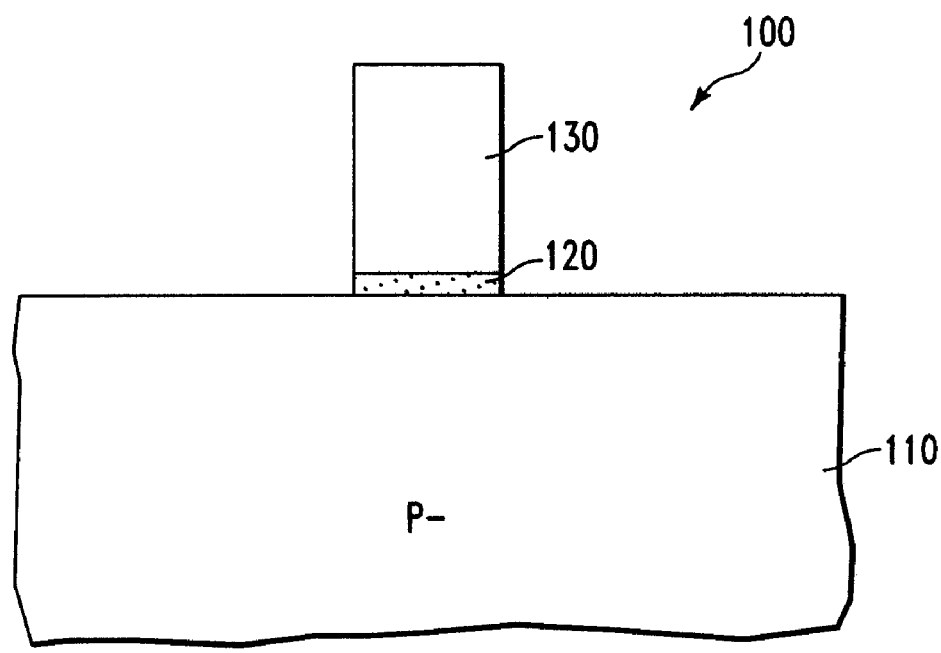
FIGS. 1-7 illustrate cross-section views of a semiconductor structure going through steps of a fabrication method, in accordance with embodiments of the present invention.

FIGS. 1-7 illustrate cross-section views of a semiconductor structure 100 going through steps of a fabrication method, in accordance with embodiments of the present invention. More specifically, with reference to FIG. 1, in one embodiment, with the assumption that the semiconductor structure 100 is to be an N channel device, the fabrication method starts out with a P− semiconductor (e.g., silicon, germanium, etc.) substrate 110. "P" indicates doped with P type dopants such as boron atoms. The minus sign as used in "P−" indicates lightly doped (i.e., less than $10^{17}$ atoms/cm$^3$).

Next, in one embodiment, a gate stack 120, 130 is formed on top of the semiconductor substrate 110. The gate stack 120, 130 comprises (i) a gate dielectric region 120 and (ii) a gate electrode region 130 which is electrically insulated from the substrate 110 by the gate dielectric region 120. In one embodiment, the gate dielectric region 120 comprises a dielectric material such as silicon dioxide, while the gate electrode region 130 comprises polysilicon.

Illustratively, the gate stack 120, 130 can be formed by (a) forming a gate dielectric layer (not shown) on the substrate 110, then (b) forming a gate layer (not shown) on the gate dielectric layer, and then (c) directionally etching the gate layer and the gate dielectric layer stopping at the substrate 110. The directionally etching in step (c) may be performed using a traditional lithography process such that what remains of the gate layer and the gate dielectric layer after the etching are the gate electrode region 130 and the gate dielectric region 120, respectively.

Figure 2:
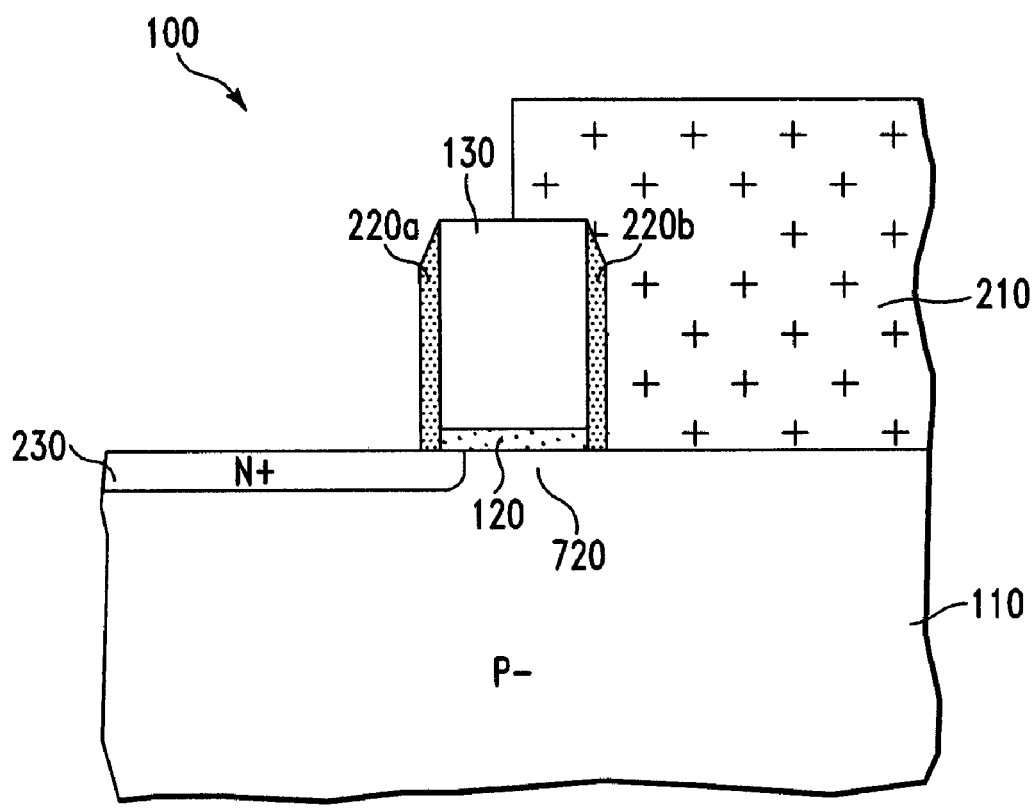

Next, with reference to FIG. 2, in one embodiment, extension spacers 220a and 220b, typically comprising silicon nitride, are formed on side walls of the gate stack 120, 130. Illustratively, the extension spacers 220a and 220b are formed by (a) depositing an extension spacer layer (not shown) on the entire structure 100 of FIG. 1, and then (b) directionally etching back the extension spacer layer, leaving the extension spacers 220a and 220b on side walls of the gate stack 120, 130.

Next, in one embodiment, a first patterned mask 210 is formed on the semiconductor structure 100 such that what is to be the drain region of the semiconductor structure 100 is covered while what is to be the source region of the semiconductor structure 100 is exposed to the surrounding ambient.

Next, the first patterned mask 210, the gate stack 120, 130, and the nitride extension spacer 220a are used as a blocking mask for forming an N source extension region 230 in the semiconductor structure 100. "N" indicates doped with N type dopants such as arsenic atoms. In one embodiment, the source extension region 230 is doped at around $10^{19}$ atoms/cm$^3$. In one embodiment, the source extension region 230 is formed by implanting N type dopants (such as arsenic atoms) in the substrate 110 by ion implantation. Optionally, a halo ion implantation process may be performed to form a halo source region (not shown) in a channel region 720 and adjacent to the source extension region 230. The halo source region is doped with P type dopants (e.g., boron atoms). Next, the first patterned mask 210 is removed by, illustratively, plasma strip.

Figure 3:
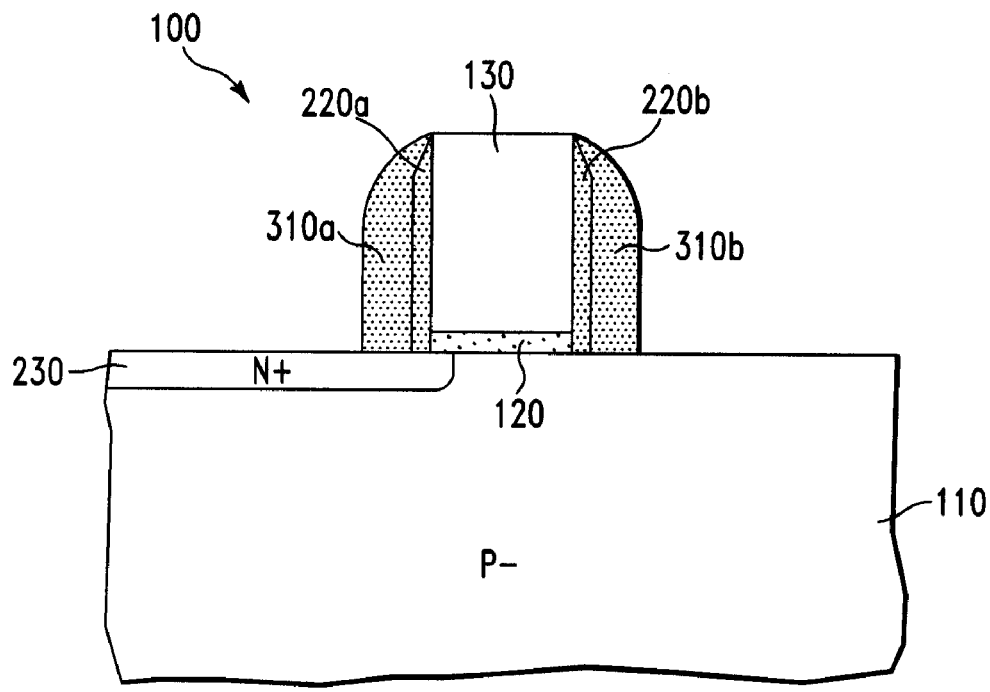

Next, with reference to FIG. 3, in one embodiment, source/drain (S/D) spacers 310a and 310b (comprising silicon nitride in one embodiment) are formed on side walls of the extension spacers 220a and 220b, respectively. The S/D spacers 310a and 310b can be formed by (a) depositing a nitride layer (not shown) on the entire structure 100 of FIG. 2 (with the first patterned mask 210 having been removed), then (b) directionally etching back the nitride layer, leaving the S/D nitride spacers 310a and 310b on the side walls of the extension spacers 220a and 220b, respectively.

Figure 4:
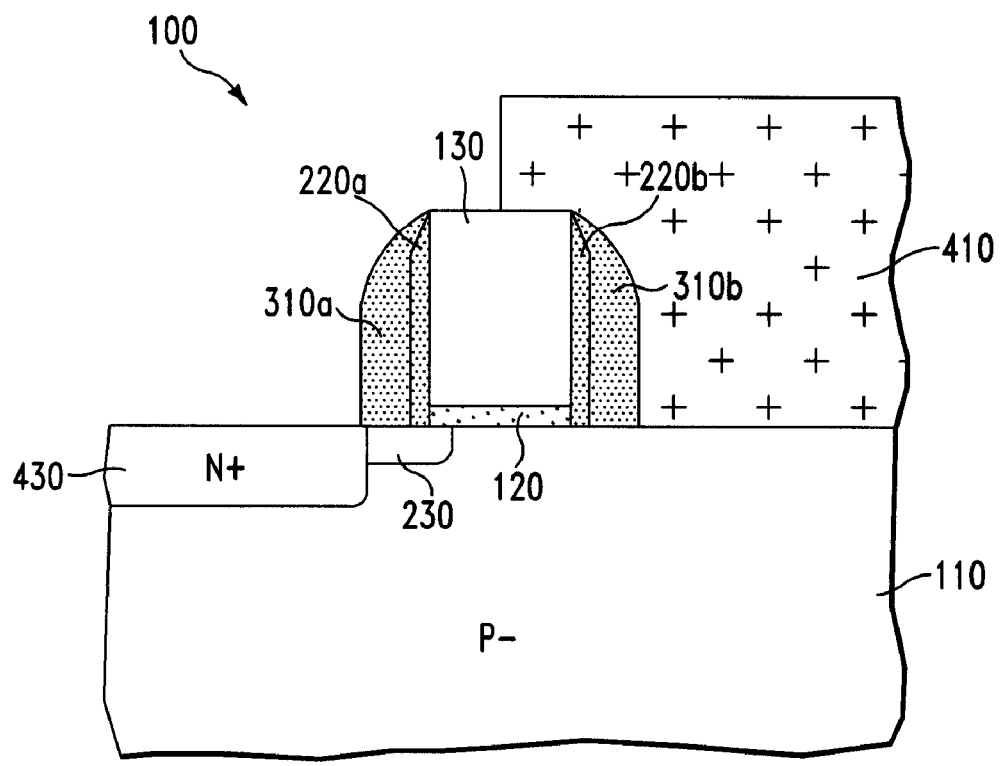

Next, with reference to FIG. 4, in one embodiment, a second patterned mask 410 is formed on the semiconductor structure 100 of FIG. 3 such that what is to be the drain region of the semiconductor structure 100 is covered while what is to be the source region of the semiconductor structure 100 is exposed to the surrounding ambient.

Next, the second patterned mask 410, the gate stack 120, 130, the extension spacer 220a, and the S/D spacer 310a are used as a blocking mask for forming an N+ source region 430 in the semiconductor substrate 110. The plus sign as used in "N+" indicates heavily doped (i.e., greater than $10^{19}$ atoms/cm$^3$). Next, the second patterned mask 410 is removed by, illustratively, plasma strip.

Figure 5:
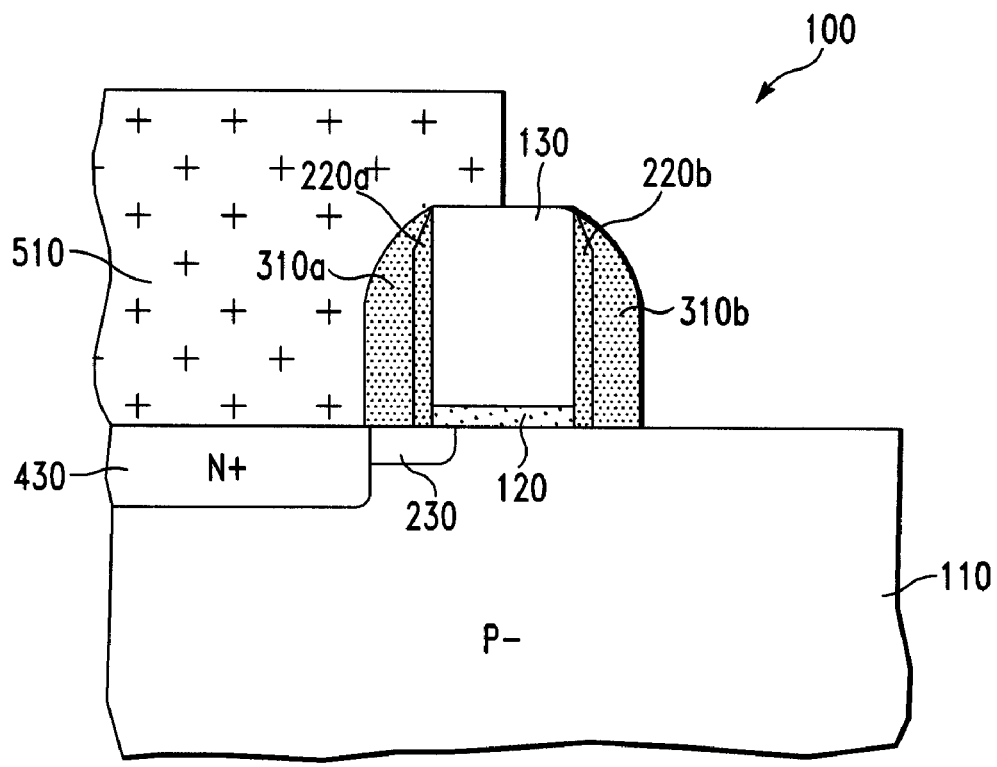

Next, with reference to FIG. 5, in one embodiment, a third patterned mask 510 is formed on the semiconductor structure 100 such that the source region 430 is covered while what is to be the drain region of the semiconductor structure 100 is exposed to the surrounding ambient. FIG. 5 shows the structure 100 right after the third patterned mask 510 is formed. Next, the spacers 310b and 220b are removed by, illustratively, a wet etching step, or an isotropic reactive ion etch (RIE). Next, the third patterned mask 510 is removed by, illustratively, plasma strip.

Figure 6:
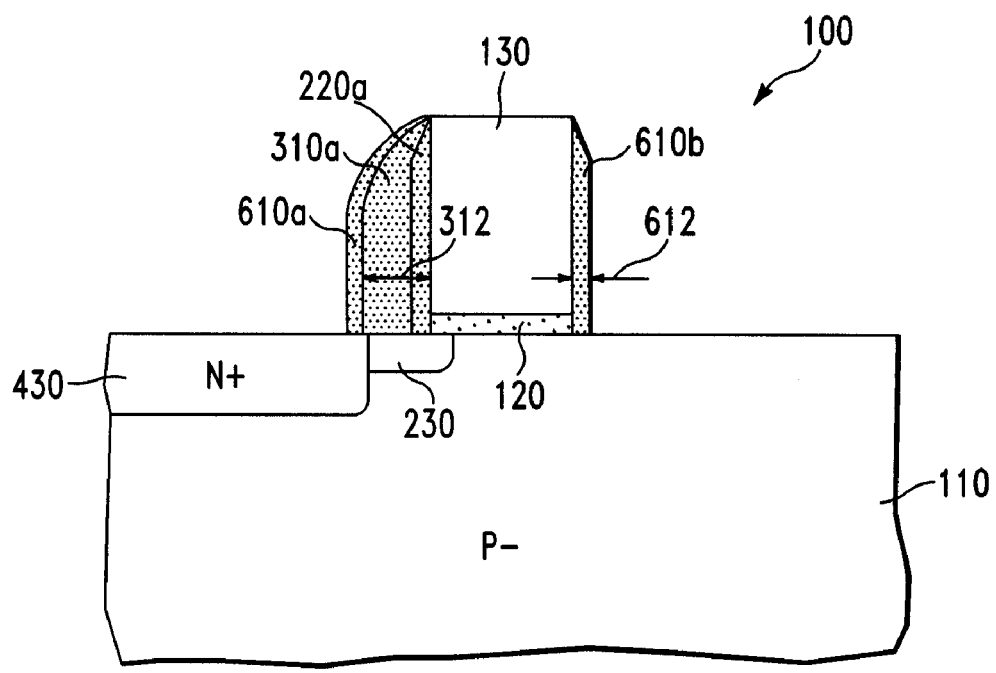

Next, with reference to FIG. 6, in one embodiment, spacers 610a and 610b (comprising silicon nitride in one embodiment) are formed on side walls of the spacer 310a and the gate stack 120, 130, respectively. Illustratively, the spacers 610a and 610b are formed by (a) depositing a spacer layer (not shown) on the entire structure 100, and then (b) directionally etching back the spacer layer, leaving the spacers 610a and 610b on side walls of the spacer 310a and the gate stack 120, 130, respectively. In one embodiment, the spacers 610a and 610b are formed such that a width 612 of the spacers 610a and 610b is less than the collective width 312 of the spacers 220a and 310a.

Figure 7:
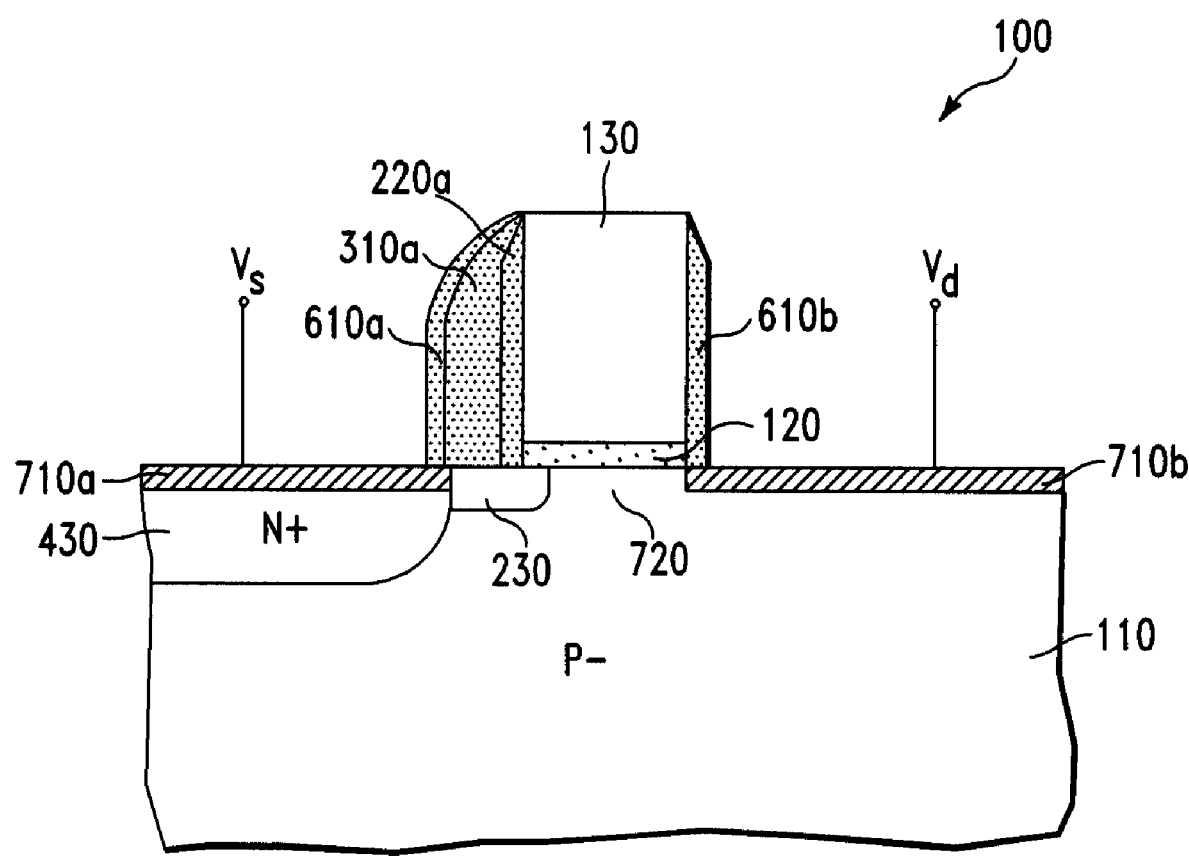

Next, with reference to FIG. 7, in one embodiment, regions 710a and 710b (comprising a silicide metal in one embodiment) are formed. The silicide regions 710a and 710b can be formed by (a) depositing a metal (e.g., platinum, cobalt, erbium, nickel, etc.) layer on top of the entire structure 100 of FIG. 6, then (b) annealing the structure 100 so that the metal in the metal layer chemically reacts with silicon of the substrate 110 to form the silicide regions 710a and 710b, and then (c) removing the unreacted metal material. Alternatively, regions 710a and 710b comprise a metal such as gold.

It can be observed that the N channel FET 100 is formed with its channel region 720 disposed between and in direct physical contact with its source block 230, 430 and its drain contact region (silicide region) 710b (i.e., asymmetrical). The source block 230, 430 comprises the source extension region 230 and the source region 430. The channel region 720 is underneath and in direct physical contact with the gate dielectric region 120.

In one embodiment, during operation of the N channel FET 100, the source block 230, 430 is coupled to a source voltage Vs (via the silicide region 710a) whereas the drain contact region 710b is coupled to a drain voltage Vd with Vd>Vs. A barrier formed between the metal-silicide of the drain contact region 710b and the channel region 720, the so-called schottky barrier, gives rise to a voltage loss from the drain contact region 710b to the channel region 720. More specifically, if Vd is greater than a certain voltage known as the saturation voltage, Vd-sat, then the drain current is nearly independent of the drain voltage. Thus, the introduction of the schottky barrier only in the drain does not significantly decrease the drain current, while introducing the benefit of a shallow drain structure which results in improved short-channel Vt control.

In the embodiments described above, the FET 100 is an N channel FET. In an alternative embodiment, the FET 100 is a P channel FET having a similar structure to that of the N channel FET described above except that (a) the substrate 110 is doped N−, and (b) regions 230 and 430 are doped P type. It should be noted that, similarly, the block 230, 430 is the source block of the P channel FET, and the region 710b is the drain contact region of the P channel FET 100.

In one embodiment, during operation of the P channel FET 100, the voltage Vd of the drain contact region 710b is more negative than the voltage Vs of the source block 230, 430, 710a. As in the case of the N channel FET describe above, in most logic circuits, the drain voltage is greater than the saturation voltage during high-speed circuit transitions, and in the saturation condition the FET drain current is nearly independent of the drain voltage; hence the introduction of the schottky barrier exclusively in the drain terminal leads to negligible loss in circuit speed, while providing the benefits of a very shallow drain junction.

In the embodiments described above, the FET 100 is an enhancement device (i.e, the device is off with zero gate voltage and a gate voltage is required to enhance the channel region 720). Alternatively, the FET 100 is a depletion device (i.e., the device is on with zero gate voltage and a gate voltage is required to deplete the channel region 720). To make the FET 100 a depletion device, the channel region 720 can be doped with the same doping polarity as that of the source block 230, 430.

In the embodiments described above, the FET 100 is a planar device. In an alternative embodiment, the FET 100 is a vertical device (i.e., FinFET). The method for forming the FinFET is similar to the method for forming the planar device 100 described above.

Figure 8A:
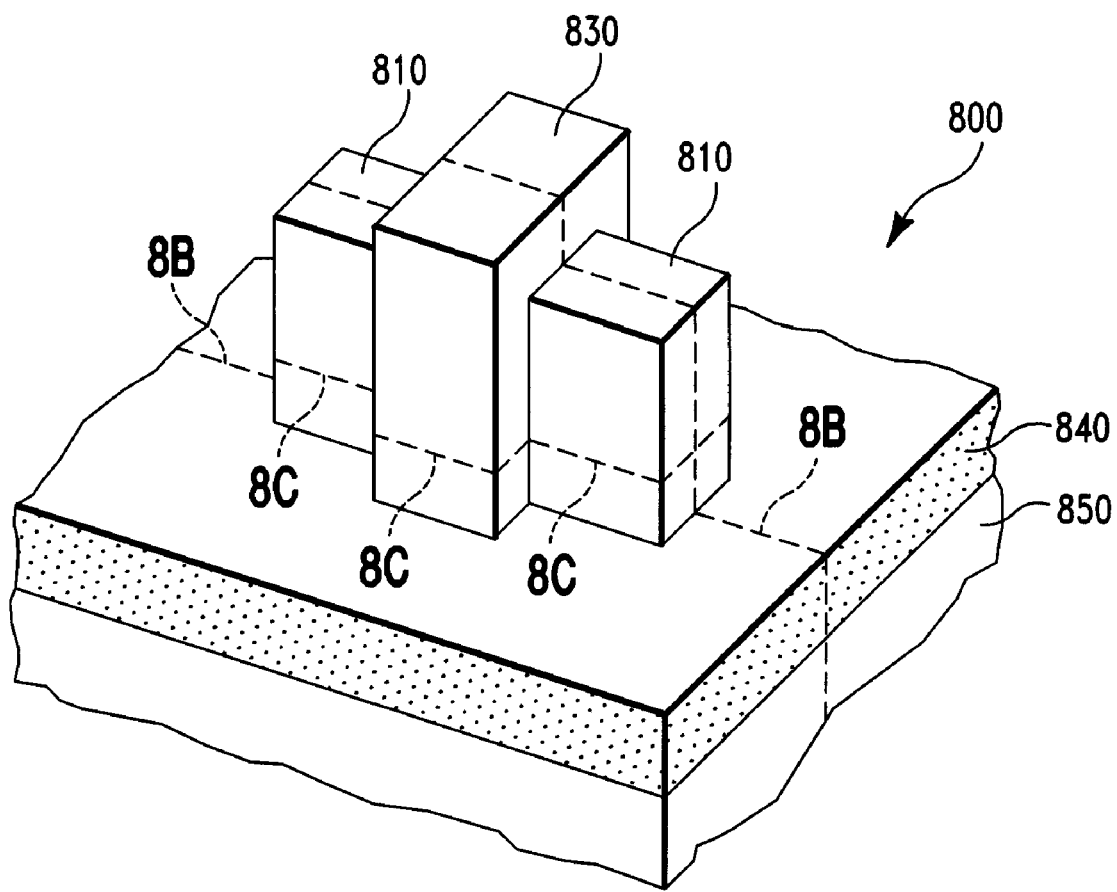
FIGS. 8A-8C illustrate another structure, in accordance with embodiments of the present invention.

FIG. 8A illustrates a perspective view of a FinFET 800, in accordance with embodiments of the present invention. The FinFET 800 comprises fin region 810 and a gate 830 wrapping around (i.e., on top and on side walls of) the fin region 810. The fin region 810 and the gate 830 are on a buried oxide layer 840 which in turn is on a semiconductor (e.g., silicon) layer 850. For simplicity, other details besides the fin region 810 and the gate 830 are omitted in FIG. 8A.

Figure 8B:
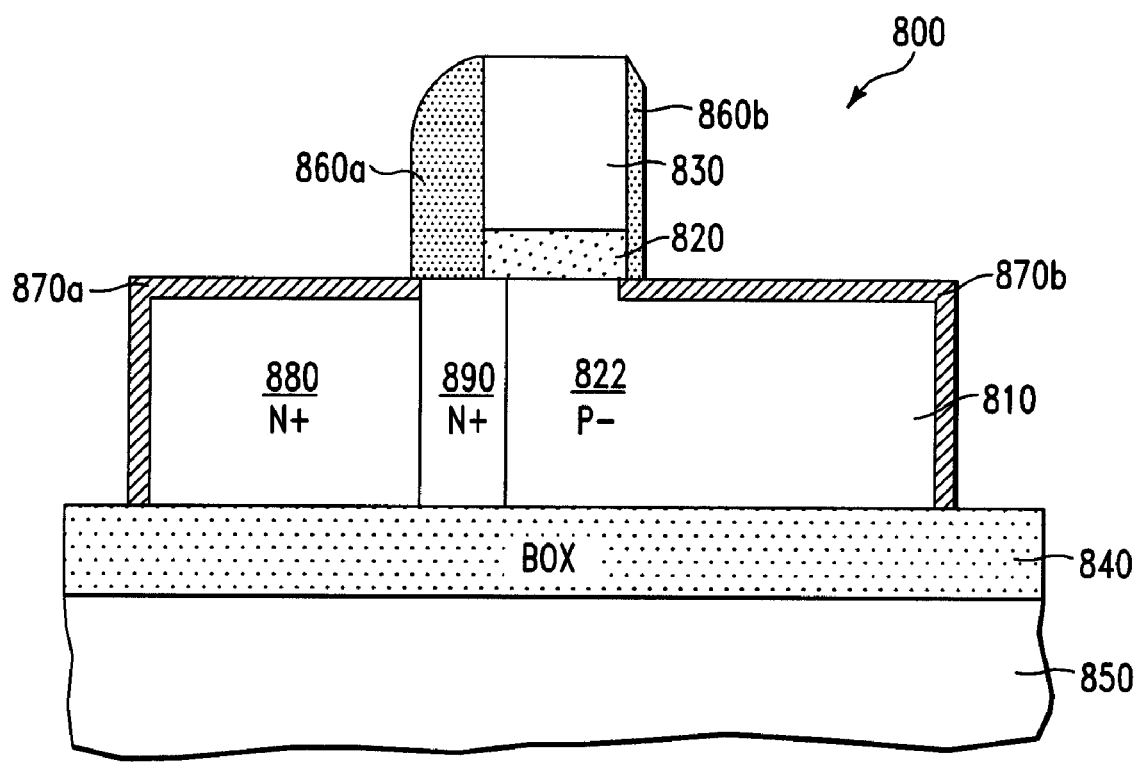
Figure 8C:
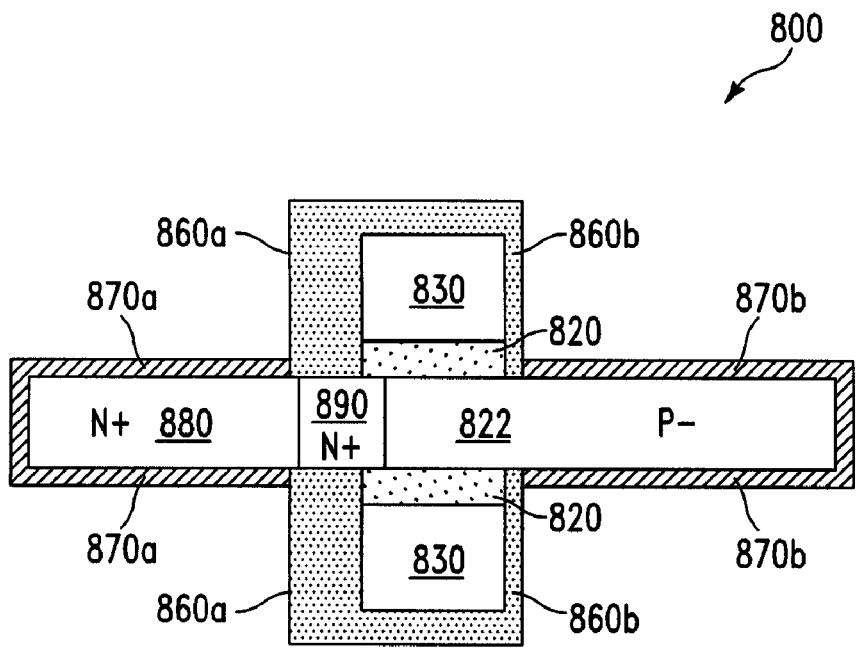

FIGS. 8B and 8C illustrate two views of the FinFET 800 (assuming this is an N channel device) along two planes defined by lines 8B and 8C, respectively (FIG. 8A). Similar to the FET 100 of FIG. 7, the FinFET 800 comprises a gate electrode region 830, a gate dielectric layer 820, a channel region 822 disposed between a source block 880, 890 and a drain contact region (silicide) 870*b*. The FinFET 800 also comprises a source contact region (silicide) 870*a*. The source block 880, 890 comprises an N+ source region 880 and an N+ source extension region 890. The fin region 810 (FIG. 8A) is doped P− type. The FinFET 800 as described above is an N channel device. Alternative, the FinFET 800 is a P channel device. In that case, the regions 880 and 890 is doped P+.

In the embodiments described above, the drain contact region 870*b* forms a coat on the silicon region of the fin region 810 (FIG. 8A) on the drain side. Alternatively, during the formation of the drain contact region 870*b*, the entire silicon region of the fin region 810 (FIG. 8A) on the drain side is silicided.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   (a) a semiconductor channel region doped with a first doping polarity;
   (b) a semiconductor source block doped with a second doping polarity and in direct physical contact with the semiconductor channel region;
   (c) a source contact region in direct physical contact with the semiconductor source block, wherein the source contact region comprises a first electrically conducting material, and wherein the semiconductor source block physically isolates the source contact region from the semiconductor channel region, and
   (d) a drain contact region in direct physical contact with the semiconductor channel region, wherein the semiconductor channel region is disposed between the semiconductor source block and the drain contact region, and wherein the drain contact region comprises a second electrically conducting material; and
   (e) a gate stack in direct physical contact with the semiconductor channel region.

2. The structure of claim 1,
   wherein the source contact region is coupled to a source voltage,
   wherein the drain contact region is coupled to a drain voltage,
   wherein the drain voltage is higher than the source voltage, and
   wherein the second doping polarity is N type.

3. The structure of claim 1,
   wherein the source contact region is coupled to a source voltage,
   wherein the drain contact region is coupled to a drain voltage,
   wherein the drain voltage is lower than the source voltage, and
   wherein the second doping polarity is P type.

4. The structure of claim 1, wherein the first and second electrically conducting materials comprise a material selected from the group consisting of platinum silicide, erbium silicide, nickel silicide, and cobalt silicide.

5. The structure of claim 1, wherein the semiconductor source block is doped with a dopant concentration greater than $10^{19}$ atoms/cm$^3$.

6. The structure of claim 1, wherein the semiconductor source block comprises (i) a source region and (ii) a source extension region,
   wherein the source region is in direct physical contact with and physically isolates the source contact region and the source extension region,
   wherein the source extension region is in direct physical contact with and physically isolates the source region and the semiconductor channel region,
   wherein the source region is thicker than the source extension region in a reference direction perpendicular to an interfacing surface between the gate stack and the semiconductor channel region.

* * * * *